(12) United States Patent
Zhang

(10) Patent No.: US 10,658,505 B1
(45) Date of Patent: May 19, 2020

(54) HIGH VOLTAGE DEVICE AND A METHOD FOR FORMING THE HIGH VOLTAGE DEVICE

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 3 days.

(21) Appl. No.: 16/182,692

(22) Filed: Nov. 7, 2018

(51) Int. Cl.
*H01L 29/78* (2006.01)
*H01L 29/08* (2006.01)
*H01L 29/45* (2006.01)
*H01L 29/10* (2006.01)
*H01L 29/06* (2006.01)
*H01L 29/66* (2006.01)
*H01L 21/02* (2006.01)
*H01L 21/762* (2006.01)
*H01L 21/265* (2006.01)
*H01L 29/36* (2006.01)

(52) U.S. Cl.
CPC .... *H01L 29/7816* (2013.01); *H01L 21/02236* (2013.01); *H01L 21/76224* (2013.01); *H01L 29/0649* (2013.01); *H01L 29/0865* (2013.01); *H01L 29/0882* (2013.01); *H01L 29/1095* (2013.01); *H01L 29/45* (2013.01); *H01L 29/66681* (2013.01); *H01L 21/26513* (2013.01); *H01L 29/086* (2013.01); *H01L 29/0878* (2013.01); *H01L 29/1083* (2013.01); *H01L 29/36* (2013.01)

(58) Field of Classification Search
CPC ............ H01L 29/7816; H01L 29/0649; H01L 29/0865; H01L 29/0882; H01L 29/1095; H01L 29/45; H01L 29/66681
See application file for complete search history.

(56) References Cited

U.S. PATENT DOCUMENTS

| | | | |
|---|---|---|---|
| 8,174,071 B2 | 5/2012 | Tien et al. | |
| 8,994,103 B2* | 3/2015 | Chen ................... | H01L 29/7816 257/335 |
| 2009/0039444 A1* | 2/2009 | Suzuki ................ | H01L 29/7834 257/392 |
| 2009/0085112 A1* | 4/2009 | Ho ...................... | H01L 29/0653 257/343 |
| 2017/0194491 A1 | 7/2017 | Zhang | |

* cited by examiner

*Primary Examiner* — Cuong Q Nguyen
(74) *Attorney, Agent, or Firm* — Viering Jentschura & Partner MBB

(57) ABSTRACT

A high voltage device may include a substrate, source and drain regions, a gate structure and an oxide layer. The substrate may include a recessed region with a recessed surface lower than a top surface of the substrate. The source and drain regions may be at least partially arranged within the substrate under the recessed surface and top surface respectively. The drain region may be positioned higher than the source region. The gate structure may include first and second portions arranged over the recessed region. The first and second portions may be nearer to the source and drain regions respectively. The oxide layer may include a first part between the first portion of the gate structure and the recessed surface, and a second part between the second portion of the gate structure and the recessed surface. The second part of the oxide layer may be thicker than the first part.

17 Claims, 7 Drawing Sheets

HIGH VOLTAGE DEVICE AND A METHOD FOR FORMING THE HIGH VOLTAGE DEVICE

TECHNICAL FIELD

The present disclosure relates generally to high voltage devices and methods for forming the high voltage devices.

BACKGROUND

High voltage devices, for example, lateral double-diffused metal oxide semiconductors (LDMOS), have been widely used for high voltage applications. Indicators of the performance of high voltage devices may include their switching speeds and reliability. The switching speeds of the high voltage devices may be affected by factors, such as their drain-to-source on resistance ($R_{dson}$). For example, a higher $R_{dson}$ may result in an increased inductance of the high voltage device, in turn resulting in a lower switching speed and more energy loss during switching. Further, the reliability of high voltage devices may be affected by impact ionization generated hot carriers trapped at silicon and silicon oxide interface regions along the current path. Such hot carriers can generate defects in the high voltage device and cause linear drain current ($I_{dlin}$) degradation.

Accordingly, it is desirable to provide an improved high voltage device with a higher switching speed and greater reliability.

SUMMARY

According to various non-limiting embodiments, there may be provided a high voltage device including a substrate, a source region, a drain region, a gate structure and an oxide layer. The substrate may include a recessed region and the recessed region may include a recessed surface arranged lower than a top surface of the substrate. The source region may be at least partially arranged within the substrate under the recessed surface. The drain region may be at least partially arranged within the substrate under the top surface and at a higher position than the source region. The gate structure may include a first portion and a second portion that may be arranged over the recessed region. The first portion may be nearer to the source region, and the second portion may be nearer to the drain region. The oxide layer may include a first part that may be arranged between the first portion of the gate structure and the recessed surface of the recessed region, and a second part that may be arranged between the second portion of the gate structure and the recessed surface of the recessed region. The second part of the oxide layer may be thicker than the first part of the oxide layer.

According to various non-limiting embodiments, there may be provided a method that may include providing a substrate and forming a recessed region in the substrate. The recessed region may include a recessed surface arranged lower than a top surface of the substrate. The method may further include forming an oxide layer over the recessed surface of the recessed region, forming a gate structure over the recessed region, forming a source region at least partially within the substrate under the recessed surface; and forming a drain region at least partially within the substrate under the top surface and at a higher position than the source region. The oxide layer may include a first part and a second part. The second part of the oxide layer may be thicker than the first part of the oxide layer. The gate structure may include a first portion and a second portion. The first portion of the gate structure may be nearer to the source region, and the second portion of the gate structure may be nearer to the drain region. The first part of the oxide layer may be arranged between the first portion of the gate structure and the recessed surface of the recessed region, and the second part of the oxide layer may be arranged between the second portion of the gate structure and the recessed surface of the recessed region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1:
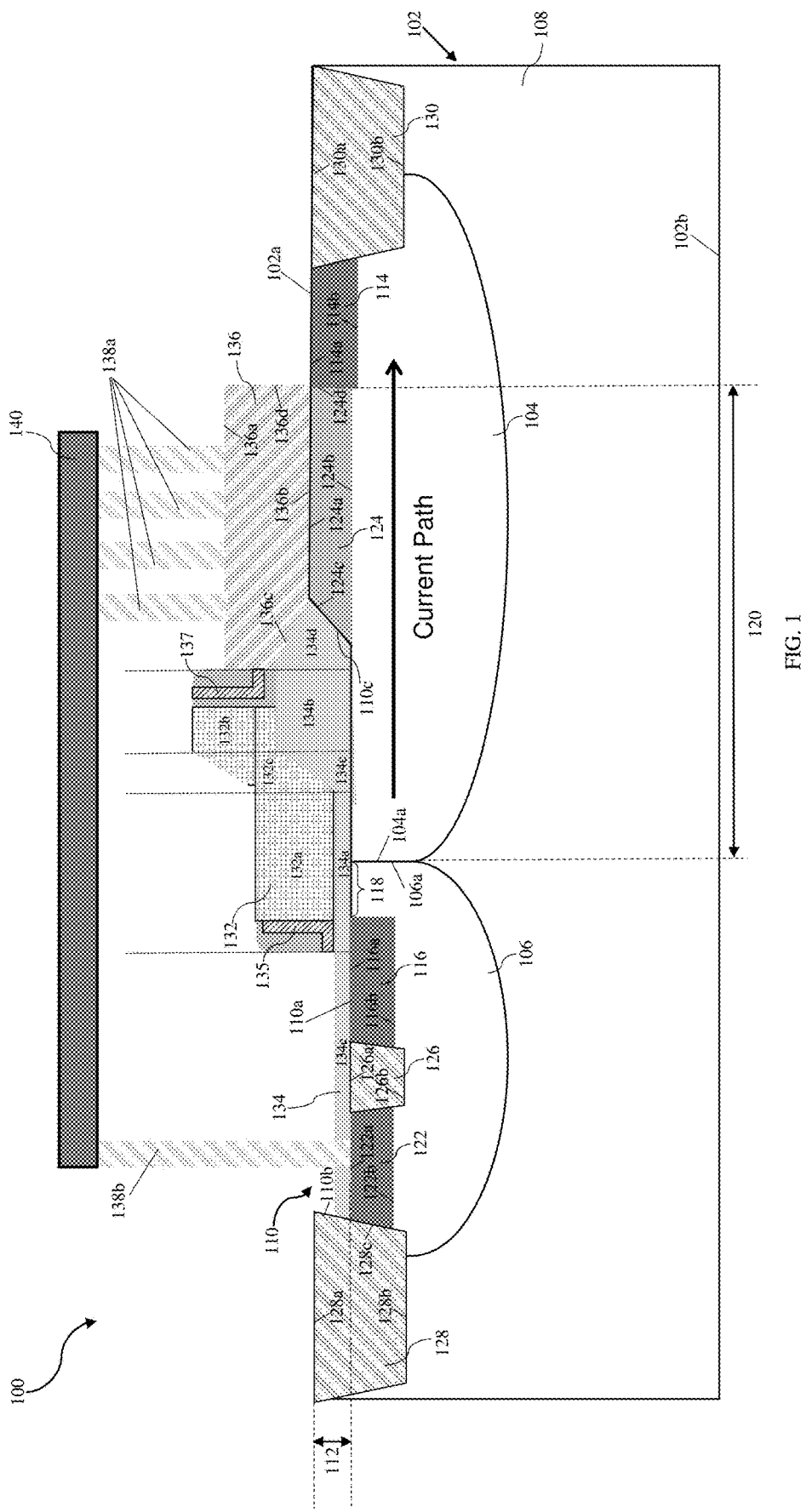
FIG. 1 shows a cross-sectional view of a high voltage device according to a non-limiting embodiment of the present invention.

The embodiments generally relate to devices, such as semiconductor devices or integrated circuits (ICs). More particularly, some embodiments relate to high voltage devices, for example, high voltage transistors such as lateral double-diffused metal oxide semiconductor (LDMOS) transistors. The high voltage devices may be employed as switching voltage regulators for power management applications and may be integrated into devices or ICs. The devices or ICs may in turn be incorporated into or used with electronic products, for example, consumer electronic products such as smart phones, tablets, TV displays and personal digital assistants (PDAs).

According to various non-limiting embodiments, there may be provided a high voltage device including a substrate, a source region, a drain region, a gate structure and an oxide layer. The substrate may include a recessed region and the recessed region may include a recessed surface arranged lower than a top surface of the substrate. The source region may be at least partially arranged within the substrate under the recessed surface. The drain region may be at least partially arranged within the substrate under the top surface and at a higher position than the source region. The gate structure may include a first portion and a second portion that may be arranged over the recessed region. The first portion may be nearer to the source region, and the second portion may be nearer to the drain region. The oxide layer may include a first part that may be arranged between the first portion of the gate structure and the recessed surface of the recessed region, and a second part that may be arranged between the second portion of the gate structure and the recessed surface of the recessed region. The second part of the oxide layer may be thicker than the first part of the oxide layer.

According to various non-limiting embodiments, a thickness of the second part of the oxide layer compared to a thickness of the first part of the oxide layer may have a ratio ranging from 6:5 to 60:1.

According to various non-limiting embodiments, the source region and the drain region may have a first conductivity type and a conductivity region may be at least partially arranged within the substrate between the drain region and the recessed region. The conductivity region may have a second conductivity type different from the first conductivity type.

According to various non-limiting embodiments, the high voltage device may further include a silicide block arranged at least partially over the conductivity region.

According to various non-limiting embodiments, the high voltage device may further include a silicide block adjacent to the second portion of the gate structure, and the second portion of the gate structure may extend vertically beyond a top surface of the silicide block.

According to various non-limiting embodiments, the high voltage device may further include a body well tap at least partially arranged within the substrate and under the recessed surface and at a lower position than the drain region.

According to various non-limiting embodiments, the body well tap may be arranged at a same horizontal level as the source region under the recessed surface.

According to various non-limiting embodiments, the high voltage device may further include an internal isolation region arranged between the body well tap and the source region. The internal isolation region may be arranged under the recessed surface.

According to various non-limiting embodiments, there may be provided a method that may include providing a substrate and forming a recessed region in the substrate. The recessed region may include a recessed surface arranged lower than a top surface of the substrate. The method may further include forming an oxide layer over the recessed surface of the recessed region, forming a gate structure over the recessed region, forming a source region at least partially within the substrate under the recessed surface; and forming a drain region at least partially within the substrate under the top surface and at a higher position than the source region. The oxide layer may include a first part and a second part. The second part of the oxide layer may be thicker than the first part of the oxide layer. The gate structure may include a first portion and a second portion. The first portion of the gate structure may be nearer to the source region, and the second portion of the gate structure may be nearer to the drain region. The first part of the oxide layer may be arranged between the first portion of the gate structure and the recessed surface of the recessed region, and the second part of the oxide layer may be arranged between the second portion of the gate structure and the recessed surface of the recessed region.

According to various non-limiting embodiments, the recessed region in the substrate and the second part of the oxide layer may be formed simultaneously.

According to various non-limiting embodiments, forming the recessed region in the substrate may include oxidising a portion of the substrate; and removing a first segment of the oxidised portion of the substrate to form the recessed region.

According to various non-limiting embodiments, the second part of the oxide layer may be formed by retaining a second segment of the oxidised portion of the substrate after removal of the first segment of the oxidised portion.

According to various non-limiting embodiments, a thickness of the second part of the oxide layer compared to a thickness of the first part of the oxide layer may have a ratio ranging from 6:5 to 60:1.

According to various non-limiting embodiments, the source region and the drain region may have a first conductivity type, and the method may further include forming a conductivity region at least partially within the substrate. The conductivity region may have a second conductivity type different from the first conductivity type, and the drain region and the recessed region may be formed such that the conductivity region is between the drain region and the recessed region.

According to various non-limiting embodiments, the method may further include arranging a silicide block at least partially over the conductivity region.

According to various non-limiting embodiments, the silicide block may be arranged adjacent to the second portion of the gate structure, and the second portion of the gate structure may extend vertically beyond a top surface of the silicide block.

According to various non-limiting embodiments, the method may further include forming a body well tap at least partially within the substrate and under the recessed surface at a lower position than the drain region.

According to various non-limiting embodiments, forming the body well tap may further include forming the body well tap at a same horizontal level as the source region under the recessed surface.

According to various non-limiting embodiment, the method may further include forming an internal isolation region under the recessed surface and the body well tap and the source region may be formed such that the internal isolation region is between the body well tap and the source region.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a cross-sectional view of a high voltage device 100 according to a non-limiting embodiment of the present invention. In a non-limiting example, the high voltage device 100 may be in the form of a lateral double-diffused metal oxide semiconductor (LDMOS) transistor.

The high voltage device 100 may include a substrate 102 including a top surface 102a and a bottom surface 102b. In a non-limiting embodiment, the substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. Substrate 102 may in addition or instead include various isolations, dopings, and/or device features. The substrate 102 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn), or combinations thereof. Other types of materials as known to those skilled in the art may also be useful for forming the substrate 102.

The substrate 102 may include a first well 104, a second well 106, and a substrate conductivity region 108. In a non-limiting embodiment, the first well 104 may be in contact with the second well 106. For example, as shown in FIG. 1, an inner edge 104a of the first well 104 may be in contact with an inner edge 106a of the second well 106. The first well 104 may be in the form of a drift well, and the second well 106 may be in the form of a body well in a non-limiting embodiment. In other non-limiting embodiments, the first well 104 may not be in contact with the second well 106, i.e. a space or other component may be arranged between the first well 104 and the second well 106.

The substrate 102 may further include a recessed region 110. The recessed region may include a recessed surface 110a arranged lower than the top surface 102a of the substrate 102. The recessed region 110 may further include a first side surface 110b and a second side surface 110c. In a non-limiting embodiment as shown in FIG. 1, the first and second side surfaces 110b, 110c may be slanted at an angle with respect to the recessed surface 110a. However, the first and second side surfaces 110b, 110c may be vertical, or substantially perpendicular, with respect to the recessed surface 110a in other alternative embodiments. A vertical distance 112 between the recessed surface 110a and the top surface 102a may range from about 400 Å to about 4000 Å in a non-limiting embodiment. At least a part of the first well 104, and at least a part of the second well 106, may underlap the recessed region 110.

A drain region 114 may be at least partially arranged within the substrate 102, for example, within the first well 104, under the top surface 102a. In various non-limiting embodiments, the first well 104 may serve as a high resistance drift region to sustain high voltage applied to the drain region 114. A source region 116 may be at least partially arranged within the substrate 102, for example, within the second well 106, under the recessed surface 110a. A channel region 118 may be formed between the source region 116 and the inner edge 106a of the second well 106. A length 120 between the drain region 114 and the inner edge 104a of the first well 104 may determine a drift distance or a drift length of the high voltage device 100, which may affect the $R_{dson}$ of the high voltage device 100. For example, increasing the length 120 may increase the $R_{dson}$ of the high voltage device 100. The length 120 may range from about 0.1 um to about 10 um in a non-limiting embodiment.

The high voltage device 100 may further include a body well tap 122 at least partially arranged within the substrate 102, for example, within the second well 106 under the recessed surface 110a of the recessed region 110. The body well tap 122 may serve as a contact for biasing the second well 106. The high voltage device 100 may further include a conductivity region 124 at least partially arranged within the substrate 102, for example, within the first well 104 under the top surface 102a of the substrate 102. The conductivity region 124 may be arranged between the drain region 114 and the recessed region 110. For example, a side surface 124c of the conductivity region 124 may form the second side surface 110c of the recessed region 110. In a non-limiting embodiment, the drain region 114, the source region 116 and the body well tap 122 may have a same thickness ranging from about 0.1 um to about 0.4 um and may have a same maximum length ranging from about 0.1 um to about 1 um. In this document, a length of a region is defined as a dimension of the region along a current flow direction of the high voltage device 100. In a non-limiting embodiment, a thickness of the conductivity region 124 may be smaller than a thickness of the drain region 114. Alternatively, the thickness of the conductivity region 124 may be the same as the thickness of the drain region 114. In a non-limiting embodiment, the thickness of the conductivity region 124 may range from about 0.1 um to about 0.4 um. In a non-limiting embodiment, a maximum length of the conductivity region 124 may be larger than a maximum length of the drain region 114. Alternatively, the maximum length of the conductivity region 124 may be the same as the maximum length of the drain region 114. In a non-limiting embodiment, the maximum length of the conductivity region 124 may range from about 0.1 um to about 10 um.

The high voltage device 100 may further include an internal isolation region 126 arranged between the body well tap 122 and the source region 116. The internal isolation region 126 may be arranged under the recessed surface 110a. The internal isolation region 126 may serve to isolate the source region 116 from the body well tap 122 in a non-limiting embodiment, which may allow the second well 106 to be biased independently from the source region 116. For example, the body well tap 122 and the source region 116 may be provided with different bias voltages. The high voltage device 100 may further include a first device isolation region 128 and a second device isolation region 130. The first device isolation region 128 may be arranged adjacent to the body well tap 122, such that the body well tap 122 is positioned between the first device isolation region 128 and the internal isolation region 126. The first device isolation region 128 may be at least partially arranged within the second well 106. The second device isolation region 130 may be arranged adjacent to the drain region 114, such that the drain region 114 is positioned between the conductivity region 124 and the second device isolation region 130. The second device isolation region 130 may be at least partially arranged within the first well 104. In a non-limiting embodiment, the first and second device isolation regions 128, 130 may serve to isolate the high voltage device 100 from external interference, such as interference from neighbouring devices. Referring to FIG. 1, in a non-limiting embodiment, each isolation region 126, 128, 130 may include a wider top portion and a narrower bottom portion, in other words, may taper towards the substrate 102. Therefore, each isolation region 126, 128, 130 may include slanted side surfaces slanted at an angle with respect to the top surface 102a or the recessed surface 110a. A portion of the slanted side surface 128c of the first device isolation region 128 may form the first side surface 110b of the recessed region 110. In alternative non-limiting embodiments, each isolation region 126, 128, 130 may instead have vertical side surfaces and the first side surface 110b of the recessed region 110 may also be vertical. Each isolation region 126, 128, 130 may be in the form of a shallow trench isolation (STI) region in a non-limiting embodiment, but may alternatively be in the form of a deep trench isolation (DTI) region in another non-limiting embodiment. Each isolation region 126, 128, 130 may include an isolation material, such as but not limited to a gap fill oxide, nitride, polysilicon or combinations thereof. In various non-limiting embodiments where each isolation region 126, 128, 130 is in the form of a DTI, polysilicon may be used as the isolation material. In a non-limiting embodiment, the first and second device isolation regions 128, 130 may have a same length ranging from about 0.1 um to about 10 um. The internal isolation region 126 may have a length smaller than the length of the first and second device isolation regions 128, 130 in a non-limiting embodiment and may have a length approximately equal to the length of the first and second device isolation regions 128, 130 in other alternative embodiments. In various non-limiting embodiments, the length of the internal isolation region 126 may range from about 0.1 um to about 0.5 um; the first and second device isolation regions 128, 130 may have a thickness ranging from about 0.2 um to about 25 um, and the internal isolation region 126 may have a thickness smaller than the thickness of the first and second device isolation regions 128, 130 and ranging from about 0.1 um to about 0.5 um.

In a non-limiting embodiment as shown in FIG. 1, the body well tap 122 may be arranged at a same horizontal level as the source region 116 under the recessed surface 110a. The internal isolation region 126 may also be arranged at a same horizontal level as the body well tap 122 and the source region 116 under the recessed surface 110a. Said differently, top surfaces 122a, 126a, 116a of the body well tap 122, internal isolation region 126 and source region 116 respectively may be at a same horizontal level (e.g. at a same distance away from the bottom surface 102b of the substrate 102). These top surfaces 122a, 126a, 116a may also be substantially aligned with the recessed surface 110a. Referring to FIG. 1, the source region 116 and the body well tap 122 may have a same thickness, and their bottom surfaces 116b, 122b may be at a same horizontal level (e.g. at a same distance away from the bottom surface 102b of the substrate 102) in a non-limiting embodiment. The internal isolation region 126 may have a larger thickness than the source region 116 and the body well tap 122, and may extend deeper into the substrate 102 as compared to the source region 116 and the body well tap 122. Said differently, a bottom surface 126b of the internal isolation region 126 may be positioned lower (e.g. nearer to the bottom surface 102b of the substrate 102) than the bottom surfaces 122b, 116b of the body well tap 122 and the source region 116. As shown in FIG. 1, in a non-limiting embodiment, as compared to the internal isolation region 126, the first device isolation region 128 may have a larger thickness. A bottom surface 128b of the first device isolation region 128 may be at a same horizontal level as the bottom surface 126b of the internal isolation region 126, but the first device isolation region 128 may extend further upwards away from the substrate 102. Said differently, a top surface 128a of the first device isolation region 128 may be positioned higher (e.g. further away from the bottom surface 102b of the substrate 102) than the top surface 126a of the internal isolation region 126. For example, the top surface 128a of the first device isolation region 128 may be positioned at a same horizontal level as the top surface 102a.

The conductivity region 124, drain region 114, and second device isolation region 130 may be arranged at a same horizontal level under the top surface 102a of the substrate 102 in a non-limiting embodiment. Said differently, top surfaces 124a, 114a, 130a of the conductivity region 124, the drain region 114, and the second device isolation region 130 may be at a same horizontal level (e.g. at a same distance away from the bottom surface 102b of the substrate 102). These top surfaces 124a, 114a, 130a may also be substantially aligned with the top surface 102a of the substrate 102. The second device isolation region 130 may have a thickness greater than the thickness of the drain region 114, and the drain region 114 may have a thickness greater than the thickness of the conductivity region 124. Thus, the second device isolation region 130 may extend deeper into the substrate 102 as compared to the drain region 114, and the drain region 114 may extend deeper into the substrate 102 as compared to the conductivity region 124. Said differently, a bottom surface 130b of the second device isolation region 130 may be positioned lower (e.g. nearer to the bottom surface 102b of the substrate 102) than a bottom surface 114b of the drain region 114 which may in turn be positioned lower (e.g. nearer to the bottom surface 102b of the substrate 102) than a bottom surface 124b of the conductivity region 124. The bottom surface 130b of the second device isolation region 130 may be at a same horizontal level as the bottom surfaces 126b, 128b of the isolation regions 126, 128. The bottom surface 124b of the conductivity region 124 may be at a same horizontal level as the recessed surface 110a. In other words, the conductivity region 124 may be arranged at a same horizontal level as the recessed region 110 in a non-limiting embodiment. Alternatively, the conductivity region 124 may be arranged deeper into the substrate 102 than the recessed region 110.

In a non-limiting embodiment as shown in FIG. 1, the first well 104 may extend deeper into the substrate 102 than the second device isolation region 130 and the second well 106 may extend deeper into the substrate 102 than the first device isolation region 128. The depth of the first well 104 may depend on the design voltage of the high voltage device 100 in a non-limiting example. The depths of the first and second wells 104, 106 from the recessed surface 110a may be the same in a non-limiting embodiment as shown in FIG. 1, but they may be different in other alternative embodiments. In a non-limiting embodiment, the depth of the first well 104 from the recessed surface 110a may range from about 0.5 um to about 10 um and the depth of the second well 106 from the recessed surface 110a may range from about 0.3 um to about 3 um. Although the first and second wells 104, 106 are at the same depth and in contact with each other in the non-limiting embodiment shown in FIG. 1, in other embodiments, the second well 106 may extend deeper into the substrate 102 and across a length of the high voltage device 100 such that the first well 104 is arranged within the second well 106.

Referring to FIG. 1, in a non-limiting embodiment, the drain region 114 may be at a higher position than the source region 116 (said differently, the drain region 114 may be further away from the bottom surface 102b of the substrate 102 as compared to the source region 116) and the body well tap 122 may be arranged at a lower position than the drain region 114 (said differently, the body well tap 122 may be nearer to the bottom surface 102b of the substrate 102 as compared to the drain region 114). For example, the top surface 114a of the drain region 114 may be higher (e.g. further away from the bottom surface 102b of the substrate 102) as compared to the top surfaces 116a, 122a of the source region 116 and the body well tap 122. Arranging the body well tap 122 at a lower position than the drain region 114 may help reduce the body well tap resistance. However, the drain region 114 may be at a same horizontal level as the source region 116 and the body well tap 122. In the non-limiting embodiment as shown in FIG. 1, the drain region 114 may extend sufficiently deep into the substrate 102 to partially overlap the source region 116 and the body well tap 122. In other words, the bottom surface 114b of the drain region 114 may be at a lower position than the top surfaces 116a, 122a of the source region 116 and the body well tap 122. However, in other non-limiting embodiments, the bottom surface 114b of the drain region 114 may be positioned at a same horizontal level as the top surfaces 116a, 122a of the source region 116 and the body well tap 122.

Each of the source region 116, drain region 114, body well tap 122, conductivity region 124, first well 104, second well 106 and substrate conductivity region 108 may include one or more dopants. In one non-limiting embodiment, the source region 116, drain region 114 and body well tap 122 may have equal doping concentrations (i.e. equal concentrations of dopants). The doping concentrations of the source region 116, drain region 114 and body well tap 122 may be higher than the doping concentrations of the first and second wells 104, 106; the doping concentrations of the first and second wells 104, 106 may be higher than the doping concentration of the substrate conductivity region 108. In one non-limiting embodiment, the doping concentration of the first well 104 may be higher than the doping concentration of the second well 106, and may be equal to the doping concentration of the conductivity region 124. In alternative non-limiting embodiments, the doping concentration of the first well 104 may be equal to the doping concentration of the second well 106, and may be higher than the doping concentration of the conductivity region 124. The doping concentration of the conductivity region 124 may be higher than the doping concentration of the substrate conductivity region 108. In a non-limiting embodiment, the doping concentration of the source region 116 may range from about $1E15$-$1E17/cm^2$, the doping concentration of the drain region 114 may range from about $1E15$-$1E17/cm^2$ the doping concentration of the body well tap 122 may range from about $1E15$-$1E17/cm^2$ and the doping concentration of the conductivity region 124 may range from about $1E11/cm^3$ to about $1E13/cm^3$. In various embodiments, the second well 106 may be configured to have a doping concentration that can provide the desired threshold voltage ($V_{TH}$) for the high voltage device 100, while preventing punch-through current. The doping concentration of the first well 104 may depend on the maximum breakdown voltage (Vbr) required for the high voltage device 100. The doping concentrations of the first well 104 and the conductivity region 124 may be selected to achieve the best "off" state and "on" state performance of the high voltage device 100. For example, the conductivity region 124 and the first well 104 may be configured to be substantially mutually depleted of free carriers in the presence of a relatively low voltage applied to the drain region 114, and this may help to reduce the electric fields in the high voltage device 100 which may in turn help to increase the breakdown voltage (Vbr) of the high voltage device 100. Such a configuration may be a mutual depletion technique referred to as Reduced Surface Field (RESURF); In a non-limiting embodiment, the doping concentration of the first well 104 may range from about $1E11/cm^2$ to about $1E13/cm^2$; the doping concentration of the second well 106 may range from about $1E12/cm^3$ to about $1E14/cm^2$, and the doping concentration of the substrate conductivity portion 108 may range from about $1E10/cm^2$ to about $1E11/cm^2$.

The source region 116, drain region 114 and the first well 104 may have a first conductivity type. For example, the source region 116, drain region 114 and the first well 104 may all have a p-type conductivity, in other words, include dopants having a p-type conductivity (e.g. p-type dopants) or alternatively, may have an n-type conductivity, in other words, include dopants having an n-type conductivity (e.g. n-type dopants). In a non-limiting embodiment, the body well tap 122, conductivity region 124, second well 106 and the substrate conductivity region 108 may have a second conductivity type different from the first conductivity type. For example, when the source region 116, drain region 114 and the first well 104 have a p-type conductivity, the body well tap 122, conductivity region 124, second well 106 and substrate conductivity region 108 may have an n-type conductivity. Alternatively, when the source region 116, drain region 114 and the first well 104 have an n-type conductivity, the body well tap 122, conductivity region 124, second well 106 and substrate conductivity region 108 may have a p-type conductivity.

In one example, the implant material for the source region 116, drain region 114, body well tap 122, conductivity region 124, first well 104, second well 106 and substrate conductivity region 108 may be the same implant material, for example, an epitaxial silicon material in a non-limiting embodiment. The p-type material may be or include, but is not limited to epitaxial silicon germanium and/or the n-type material may be or include, but is not limited to doped silicon material including n-type dopants. P-type dopants can for example, include but are not limited to boron (B), aluminium (Al), indium (In) or a combination thereof, while n-type dopants can include carbon (C), phosphorus (P), arsenic (As), antimony (Sb), or a combination thereof. Other types of implant materials and dopants as known to those skilled in the art may also be useful for forming the source region 116, drain region 114, body well tap 122, conductivity region 124, first well 104, second well 106, and substrate conductivity region 108.

The high voltage device 100 may further include a gate structure 132. The gate structure 132 may include a first portion 132a, a second portion 132b and a third portion 132c arranged over the recessed region 110. The first portion 132a of the gate structure 132 may be nearer to the source region 116 (as compared to the second portion 132b) and may at least partially overlap the source region 116. The second portion 132b of the gate structure 132 may be nearer to the drain region 114 (as compared to the first portion 132a) and may be positioned a distance away from the drain region 114. The third portion 132c of the gate structure 132 may be arranged between the first and second portions 132a, 132b of the gate structure 132 to join these portions 132a, 132b of the gate structure 132. In a non-limiting embodiment as shown in FIG. 1, the second portion 132b of the gate structure 132 may be arranged at a higher position than the first portion 132a of the gate structure 132, and the third portion 132c of the gate structure 132 may be slanted at an angle with reference to the first and second portions 132a, 132b. However, the third portion 132c of the gate structure 132 need not be slanted and may be in the form of a vertical structure or any other structure suitable for joining the first and second portions 132a, 132b of the gate structure 132. In a non-limiting embodiment, each of the first, second and third portions 132a, 132b, 132c of the gate structure 132 may have a thickness ranging from about 0.1 um to about 0.5 um. At least a part of the first portion 132a of the gate structure 132 may be arranged over the channel region 118. At least a part of the first well 104 and at least a part of the second well 106 may be arranged under the gate structure 132. The degree of overlap between the gate structure 132 and the first well 104 may affect the $R_{dson}$ and the drive current of the high voltage device 100. In a non-limiting embodiment, the gate structure 132 may be formed of a conductive material, such as polysilicon (which may be doped or undoped) but other conductive materials, such as metals or alloys for example TiN, TaN, W, and combinations thereof would be recognized by those skilled in the art.

The first portion 132a of the gate structure 132 may include a first spacer 135 and the second portion 132b of the gate structure 132 may include a second spacer 137. In a non-limiting embodiment, the spacers 135, 137 may be in the form of dielectric spacers and may include an insulating material such as, but not limited to, silicon oxide, silicon nitride, silicon oxynitride, combinations thereof, or other types of dielectric materials, or multiple layers of insulation material. Other materials as known to those skilled in the art may also be useful for forming the first and second spacers 135, 137.

The high voltage device 100 may further include an oxide layer 134 which may include a first part 134a and a second part 134b. The first part 134a of the oxide layer 134 may be arranged between the first portion 132a of the gate structure 132 and the recessed surface 110a of the recessed region 110. The second part 134b of the oxide layer 134 may be arranged between the second portion 132b of the gate structure 132 and the recessed surface 110a of the recessed region 110. The second part 134b of the oxide layer 134 may be thicker than the first part 134a of the oxide layer 134. A thickness of the first part 134a of the oxide layer 134 may range from about 50 Å to about 500 Å in a non-limiting embodiment. A thickness of the second part 134b of the oxide layer 134 may range from about 1500 Å to about 2000 Å in a non-limiting embodiment, alternatively from above 500 Å to about 3000 Å. A thickness of the second part 134b of the oxide layer 134 compared to a thickness of the first part 134a of the oxide layer 134 may have a ratio ranging from about 6:5 to about 60:1 in a non-limiting embodiment. The oxide layer 134 may include a third part 134c between the third portion 132c of the gate structure 132 and the recessed surface 110a in a non-limiting embodiment. When the third portion 132c of the gate structure 132 is slanted, the third part 134c of the oxide layer 134 may have a thickness that increases linearly from a first end adjacent to the first part 134a of the oxide layer 134 to a second end adjacent to the second part 134b of the oxide layer 134. The first end of the third part 134c of the oxide layer 134 may have a same thickness as the first part 134a of the oxide layer 134, and the second end of the third part 134c of the oxide layer 134 may have a same thickness as the second part 134b of the oxide layer 134. The oxide layer 134 may further include a fourth part 134d arranged between the second part 134b of the oxide layer 134 and the conductivity region 124. When the side surface 124c of the conductivity region 124 is slanted, the fourth part 134d of the oxide layer 134 may have a thickness that decreases linearly from a first end adjacent to the second part 134b of the oxide layer 134 to a second end adjacent to the conductivity region 124. The first end of the fourth part 134d of the oxide layer 134 may have a same thickness as the second part 134b of the oxide layer 134. The oxide layer 134 may further include a fifth part 134e arranged between the first part 134a of the oxide layer 134 and the first device isolation region 128. A thickness of the fifth part 134e of the oxide layer 134 may be the same as a thickness of the first part 134a of the oxide layer 134. In a non-limiting embodiment, the oxide layer 134 (including the first to fifth parts 134a, 134b, 134c, 134d, 134e) may be formed of silicon oxide. Other materials as known to those skilled in the art may also be useful for forming the oxide layer 134.

In a non-limiting embodiment, the high voltage device 100 may further include a silicide block 136 arranged at least partially over the conductivity region 124. Referring to FIG. 1, the silicide block 136 may be arranged adjacent to the second portion 132b of the gate structure 132. The second portion 132b of the gate structure 132 may extend vertically beyond a top surface 136a of the silicide block 136. A first bottom surface 136b of the silicide block 136 may be substantially aligned with the top surface 102a of the substrate 102, and the silicide block 136 may extend horizontally beyond the top surface 102a towards the second portion 132b of the gate structure 132, such that a second bottom surface 136c of the silicide block 136 is arranged over the recessed region 110 (e.g. over the fourth part 134d of the oxide layer 134). In a non-limiting embodiment as shown in FIG. 1, the second bottom surface 136c of the silicide block 136 may be slanted at an angle with respect to the first bottom surface 136b and the fourth part 134d of the oxide layer 134 may include a slanted surface substantially aligned with the second bottom surface 136c of the silicide block 136. The silicide block 136 may be formed of a non-conducting material, such as silicon nitride, silicon oxide, or combinations thereof, but other materials as known to those skilled in the art may also be useful for forming the silicide block. In a non-limiting example, a length of the silicide block 136 may be such that a side surface 136d of the silicide block 136 is substantially aligned with a side surface 124d of the conductivity region 124. A maximum length of the silicide block 136 may range from about 0.1 um to about 10 um in a non-limiting embodiment. A maximum thickness of the silicide block 136 may range from about 0.1 um to about 0.5 um in a non-limiting embodiment.

The high voltage device 100 may further include a BEOL metallisation layer above the substrate 102 covering the first device isolation region 128, the recessed region 110, the gate structure 132 and the silicide block 136 in a non-limiting embodiment. The BEOL metallisation layer may include an interlevel dielectric (ILD) layer in a lower portion and an intra-metal dielectric (IMD) layer in an upper portion. A plurality of contacts 138a, 138b may be formed in the ILD layer, and may include one or more first contacts 138a in contact with the silicide block 136 and one or more second contacts 138b in contact with the body well tap 122. The one or more second contacts 138b in contact with the body well tap 122 may extend through the fifth part 134e of the oxide layer 134. In a non-limiting embodiment, the first contacts 138a may be electrically coupled with the second contacts 138b. A conductive line 140 may electrically couple the first contacts 138a and the second contacts 138b. For example, each contact 138a, 138b may at one end be in contact with the silicide block 136 or the body well tap 122, and at the other end, may be in contact with the conductive line 140 (which may be formed in the IMD layer). Alternatively, third contacts (not shown) in contact with the gate 132 may also be provided and the first contacts 138a in contact with the silicide block 136 may be in contact with the third contacts instead of the second contacts 138b. The contacts 138a, 138b may help to reduce contact resistance and facilitate contact to the conductive line 140. The contacts 138a, 138b and the conductive line 140 may be formed of metal, such as but not limited to silver, copper, gold, aluminium, alloys thereof, or combinations thereof. Other conductive materials as known to those skilled in the art may also be useful in forming the contacts 138a, 138b and conductive line 140.

In use, the body well tap 122 and the silicide block 136 may be coupled to a first voltage via contacts 138a, 138b and conductive line 140; whereas, the drain region 114 may be coupled to a second voltage (which may be for example, different from the first voltage) via other contacts not shown in the figures. In one non-limiting embodiment, the first voltage may be lower than the second voltage so as to reduce surface electric field and gate-to-drain capacitance (or Miller capacitance) to improve the breakdown voltage (Vbr) and the switching speed of the high voltage device 100. The high voltage device 100 may switch between an "on" state where there may be current flow through the device 100 and an "off" state where there may not be current flow through the device 100. In the "on" state, current may flow between the source and drain regions 116, 114 through the channel region 118 and the drift distance 120. The direction of current flow may depend on the polarity of the source and drain regions 116, 114. FIG. 1 shows an example of a current flow from the source region 116 to the drain region 114 when the source and drain regions 116, 114 both have an n-type conductivity. In an alternative embodiment, current flows from the drain region 114 to the source region 116 when the source and drain regions 116, 114 both have a p-type conductivity. The first voltage applied to the contacts 138a (on top of and in contact with silicide block 136) via the conductive line 140 may serve to shift the electric field towards the drain region 114. This may help to reduce impact ionization at the edge of the gate structure 132 which in turn, may help to improve the gate dielectric breakdown voltage (Vbr) and allow a lower $R_{dson}$ to be obtained with a higher breakdown voltage.

In various embodiments where the drain region 114 is at a higher position than the source region 116 and the channel region 118, the substrate current (Dc) may be shifted away from the silicon-silicon oxide interface (e.g. the interface between the substrate 102 and the oxide layer 134), and may be forced to flow through the bulk of the substrate 102 e.g. through the drift region which may be provided by the first well 104. Such buried current conduction through the drift region may help to minimize or prevent hot carriers from being trapped at the silicon-silicon oxide interface, hence minimizing or preventing hot carrier injection (HCI) degradation of the high voltage device 100. By forcing the substrate current (Dc) to flow through the bulk of the substrate 102, substrate surface scattering effect may also be reduced. This may in turn allow higher carrier mobility to be achieved in the drift region and hence, a lower $R_{dson}$ and higher linear current may be achieved. In turn, a higher switching speed and better performance of the high voltage device 100 may be achieved. In various embodiments, arranging the conductivity region 124 at least partially within the first well 104 may help to achieve a double RESURF effect which may effectively deplete the first well 104 during operation of the high voltage device 100. This may in turn improve the breakdown voltage (Vbr) of the high voltage device 100. In various embodiments where the second part 134b of the oxide layer 134 is thicker than the first part 134a of the oxide layer 134, a lower gate to drain capacitance (or Miller capacitance) may be achieved at the drift region (which may be provided by the first well 104). In turn, less charge may be required to charge up the high voltage device 100 and a faster switching speed may be achieved.

FIGS. 2A-2F show cross-sectional views that illustrate a method for fabricating the high voltage device 100 according to a non-limiting embodiment of the present invention.

Figure 2A:
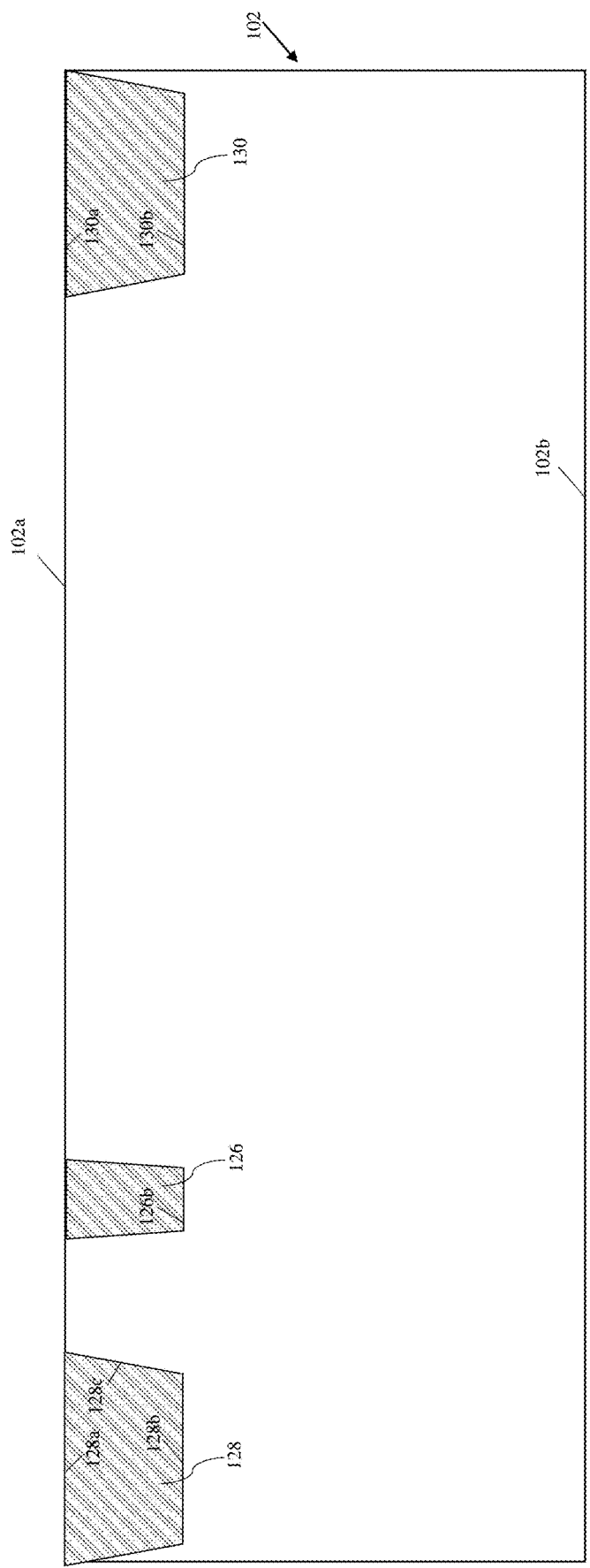
FIGS. 2A-2F show cross-sectional views that illustrate a method for fabricating the high voltage device of FIG. 1 according to a non-limiting embodiment of the present invention.

Referring to FIG. 2A, according to a non-limiting embodiment, a method for fabricating the high voltage device 100 may begin by providing the substrate 102 and forming the first device isolation region 128, the internal isolation region 126, and the second device isolation region 130 in the substrate 102. Forming the isolation regions 128, 126, 130 may include forming a pad oxide layer over the substrate 102, forming a barrier layer over the pad oxide layer, and patterning the pad oxide layer, barrier layer, and substrate 102 to form trenches in the substrate 102. The patterning may be performed by, for example, forming a photoresist mask having one or more openings over the intended regions for the trenches in the substrate 102 and etching the barrier layer, pad oxide layer, and substrate 102 through the openings of the photoresist mask. Forming the isolation regions 128, 126, 130 may further include growing a linear oxide layer in the trenches and depositing a gap fill layer (by, for example, a chemical vapor deposition (CVP) process under high density plasma (HDP) conditions) over the barrier layer and in the trenches over the linear oxide layer. The gap fill layer may then be planarized by, for example, using a chemical mechanical planarization (CMP) process to form the isolation regions 128, 126, 130. The remaining portions of the barrier layer may subsequently be removed using for example, a wet etching process. In a non-limiting embodiment, the pad oxide layer and the linear oxide layer may include silicon oxide, the barrier layer may include silicon nitride and the gap fill layer may include silicon dioxide, silicon oxynitride or combinations thereof.

Other techniques or materials as known to those skilled in the art may also be useful for forming the isolation regions 128, 126, 130 in the substrate 102.

Figure 2B:
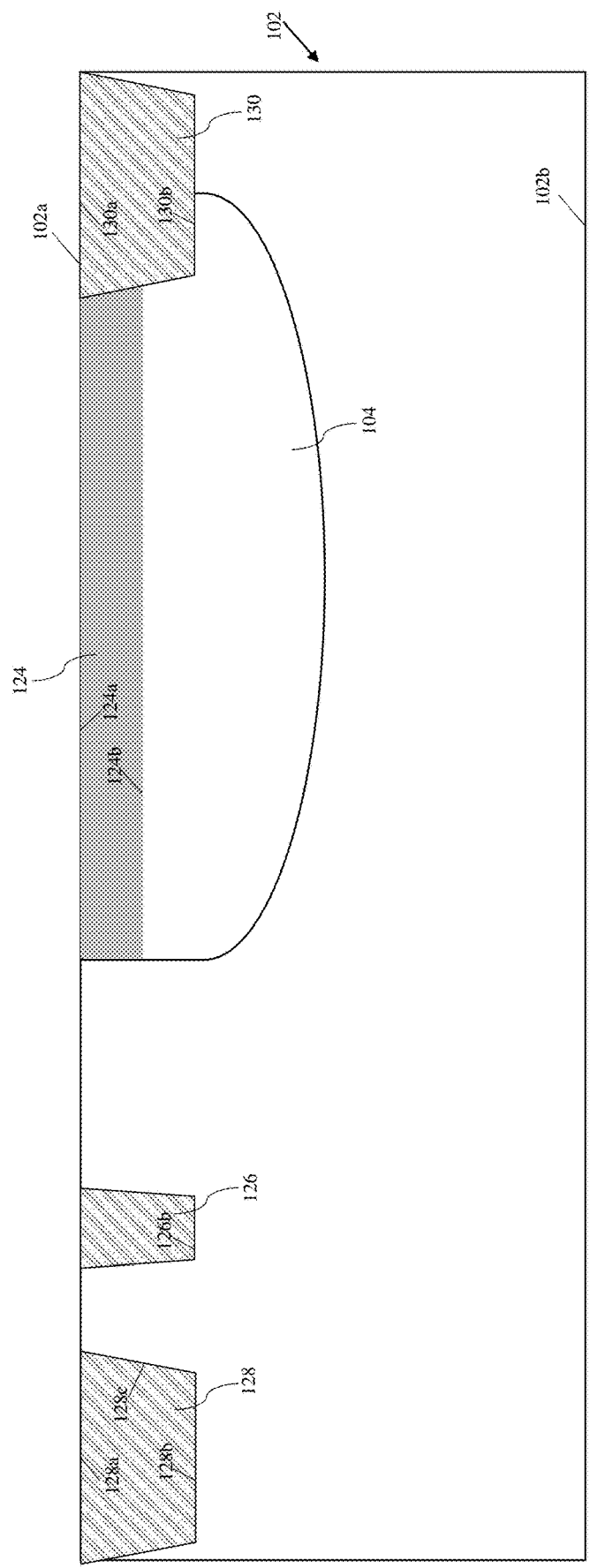

Referring to FIG. 2B, according to a non-limiting embodiment, the method for fabricating the high voltage device 100 may further include forming the first well 104 in the substrate 102 and forming the conductivity region 124 at least partially within the substrate 102 over the first well 104. The first well 104 may be formed by, for example, implanting a region of the substrate 102 intended for the first well 104 with either p-type dopants (if the first well 104 has p-type conductivity) or n-type dopants (if the first well 104 has n-type conductivity). This may be done by ion implantation. For example, a first well implant mask (e.g. a photoresist layer patterned by a lithographic mask) may be formed over the substrate 102 to expose the region of the substrate 102 intended for the first well 104 and either p-type or n-type dopants may be introduced into the exposed region of the substrate 102. The conductivity region 124 may be formed by, for example, implanting a region of the substrate 102 above the first well 104 with either p-type dopants (if the conductivity region 124 has p-type conductivity) or n-type dopants (if the conductivity region 124 has n-type conductivity). This may be done by ion implantation. For example, a conductivity region mask may be formed over the substrate 102 to expose the region of the substrate 102 above the first well 104, and either p-type or n-type dopants may be introduced into the exposed region of the substrate 102. In a non-limiting example, a same implant mask is used as the first well implant mask and the conductivity region mask but separate implant masks may also be used in alternative non-limiting examples. Other techniques or materials as known to those skilled in the art may also be useful for forming the first well 104 and the conductivity region 124.

Figure 2C:
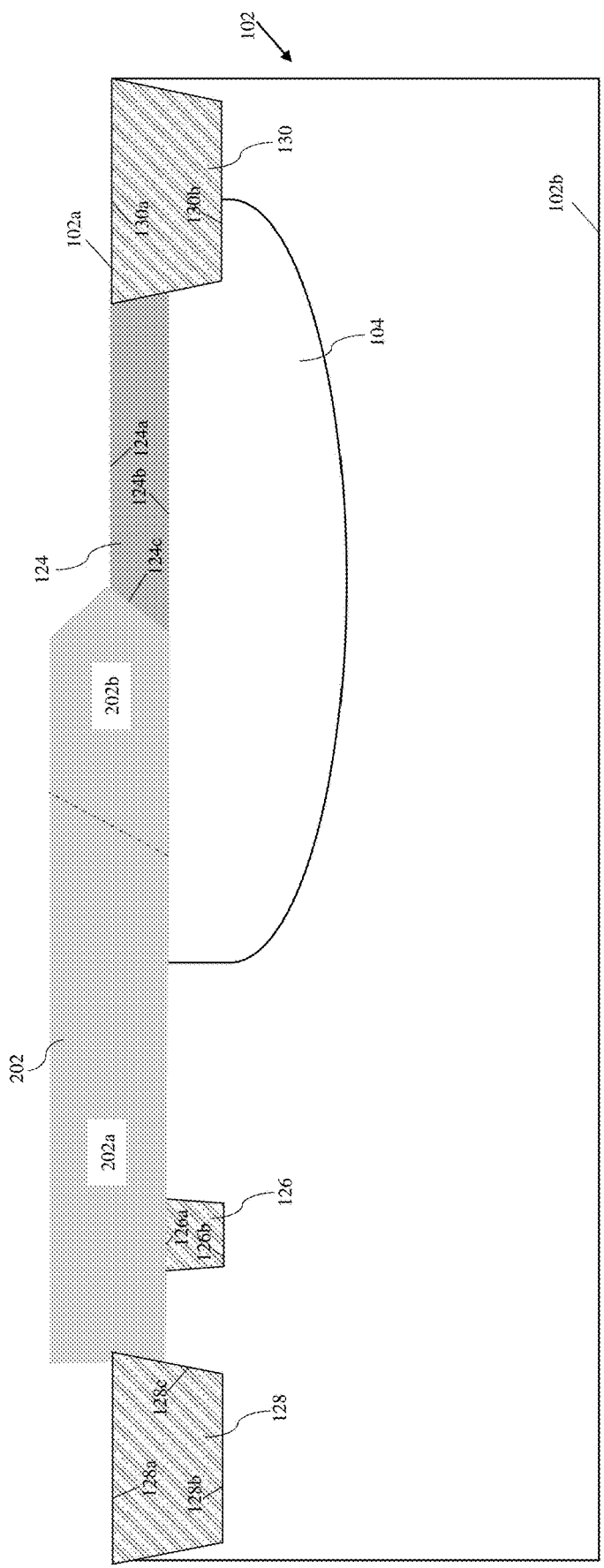
Figure 2D:
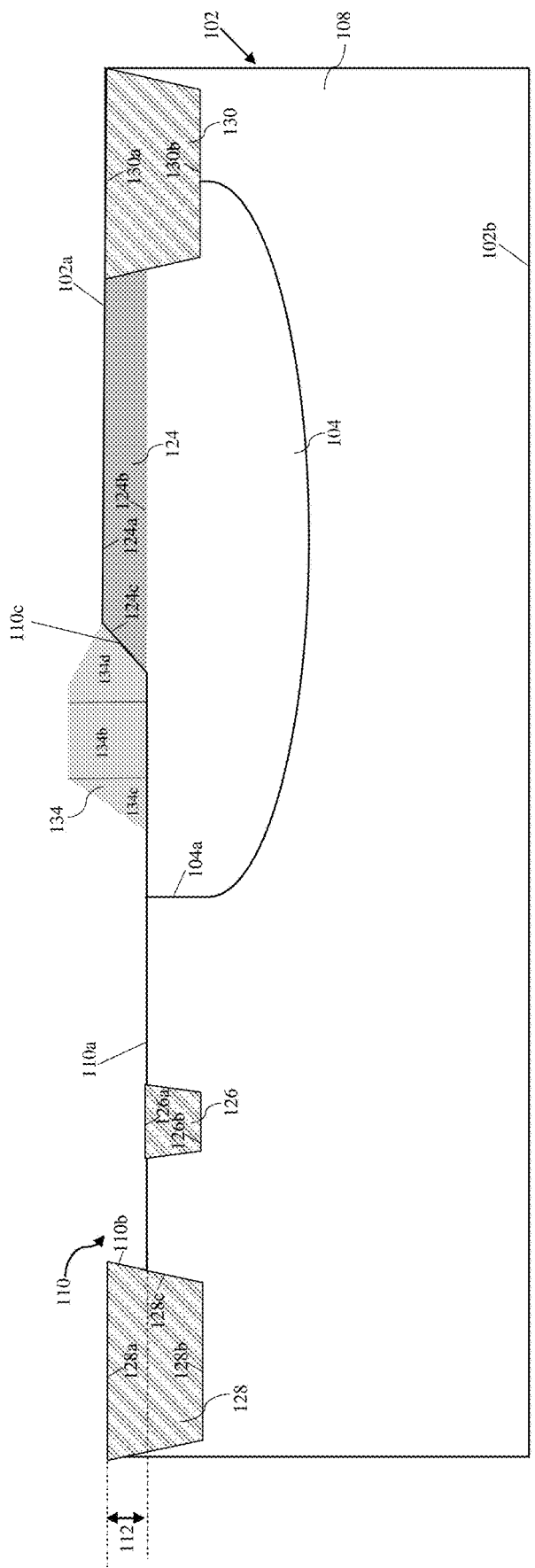
Figure 2E:
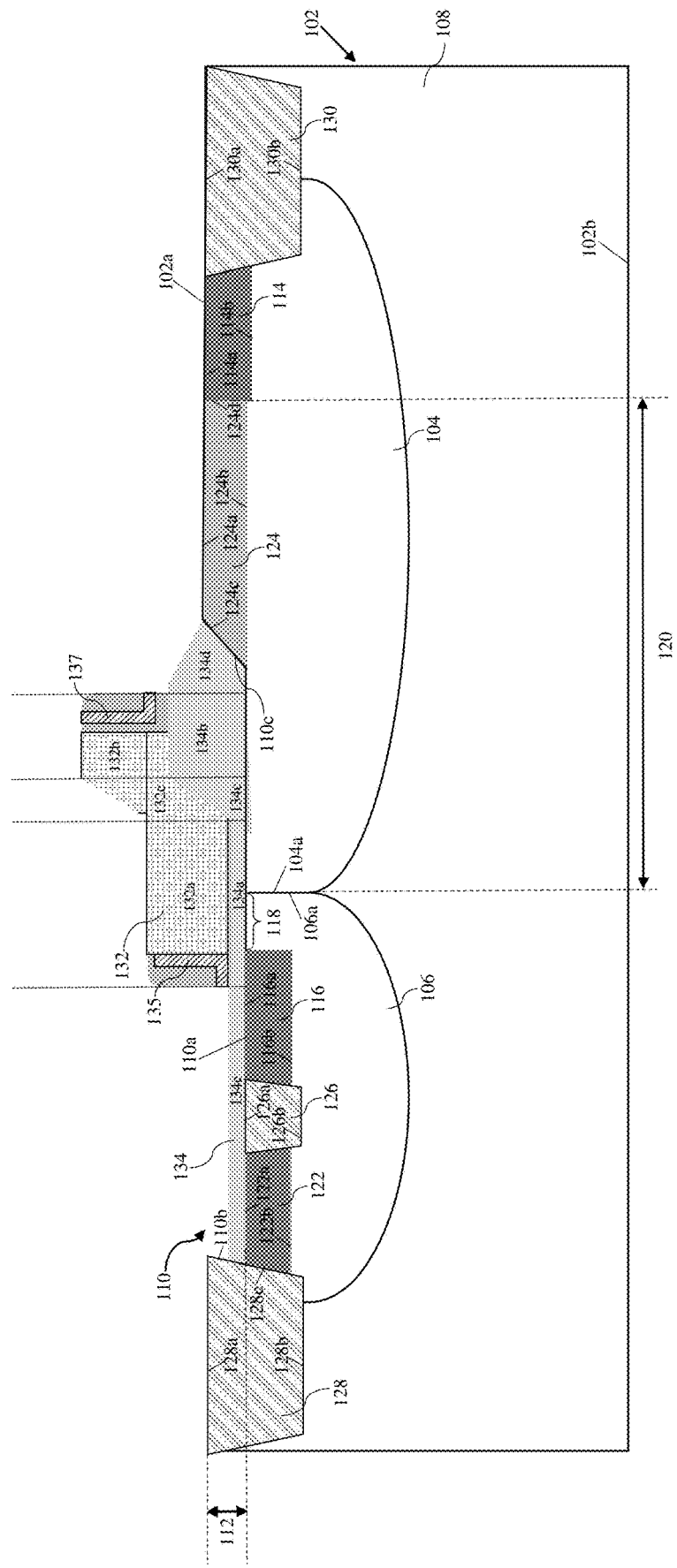

Referring to FIGS. 2C-2E, according to a non-limiting embodiment, the method may further include forming the recessed region 110 in the substrate 102 and forming the oxide layer 134 over the recessed surface 110*a* of the recessed region 110. In a non-limiting embodiment, the recessed region 110 in the substrate 102 and the second part 134*b* (together with the third and fourth parts 134*c*, 134*d*) of the oxide layer 134 may be formed simultaneously. For example, the recessed region 110 may be formed via a LOCOS (local oxidation of silicon) technique. Forming the recessed region 110 in the substrate 102 may include oxidising a portion of the substrate 102 intended for the recessed region 110 in a non-limiting embodiment. A pad oxide layer may first be formed over the substrate 102, and a barrier layer may then be formed over the pad oxide layer. Photolithography may subsequently be performed to etch the pad oxide layer and the barrier layer to expose the portion of the substrate 102 intended for the recessed region 110. A layer of thermal oxide may subsequently be grown in the exposed portion of the substrate 102. This may oxidise the portion of the substrate 102 intended for the recessed region 110, forming an oxidised portion 202 as shown in FIG. 2C. The barrier layer may then be removed. In a non-limiting embodiment, the pad oxide layer may include silicon oxide, and the barrier layer may include silicon nitride. As shown in FIG. 2C and FIG. 2D, forming the recessed region 110 in the substrate 102 may further include removing a first segment 202*a* of the oxidised portion 202 of the substrate 102 to form the recessed region 110 and forming the second, third and fourth parts 134*b*, 134*c*, 134*d* of the oxide layer 134 by retaining a second segment 202*b* of the oxidised portion 202 of the substrate 102 after removal of the first segment 202*a* of the oxidised portion 202. The first segment 202*a* of the oxidised portion 202 may be removed by forming a mask over the oxidised portion 202 to expose the first segment 202*a* and then etching off the first segment 202*a*. The above described process for forming the recessed region 110 may help to improve the quality of the silicon-silicon oxide interface between the substrate 102 and the recessed region 110. However, other techniques or materials as known to those skilled in the art may also be useful for forming the recessed region 110 and the second, third and fourth parts 134*b*, 134*c*, 134*d* of the oxide layer 134.

Referring to FIG. 2E, in a non-limiting embodiment, the method may further include forming the second well 106, the first and fifth parts 134*a*, 134*e* of the oxide layer 134, the gate structure 132 including the spacers 135, 137, the source and drain regions 114, 116, and the body well tap 122.

In a non-limiting example, the second well 106 may be formed in the substrate 102 by, for example, implanting a region of the substrate 102 intended for the second well 106 with either p-type dopants (if the second well 106 has p-type conductivity) or n-type dopants (if the second well 106 has n-type conductivity). This may be done by ion implantation. For example, a second well implant mask (e.g. a photoresist layer patterned by a lithographic mask) may be formed over the substrate 102 to expose the region of the substrate 102 intended for the second well 106, and either p-type or n-type dopants may be introduced into the exposed region of the substrate 102. Other techniques as known to those skilled in the art may also be useful for forming the second well 106.

In a non-limiting example, the first part 134*a* and fifth part 134*e* of the oxide layer 134 may be formed on the substrate 102, for example, over the recessed surface 110*a* of the recessed region 110. In a non-limiting example, the first part 134*a* and fifth part 134*e* of the oxide layer 134 may be formed by growing the oxide layer 134 using thermal oxidation, chemical vapor deposition (CVD) or other techniques as known to those skilled in the art.

In a non-limiting example, the gate structure 132 may be disposed over the recessed region 110 by first depositing a gate electrode layer over the substrate 102. The gate electrode layer may include a silicon layer, which may be in the form of a polysilicon layer and may be deposited by CVD in a non-limiting example. The gate electrode layer may then be patterned to form the gate structure 132 by providing a gate mask to protect the portion of the gate electrode layer intended for forming the gate structure 132, and removing the exposed portions of the gate electrode layer using for example an anisotropic etching technique, such as reactive-ion etching (RIE). Other techniques and materials as known to those skilled in the art may also be useful for forming the gate structure 132.

In a non-limiting example, the spacers 135, 137 may be formed by depositing a dielectric layer over the substrate 102 and selectively removing portions of the dielectric layer. In a non-limiting example, the dielectric layer may include a dielectric material, such as but not limited to, silicon oxide, silicon nitride, or a combination thereof, and may be deposited by CVD, and portions of the dielectric layer may be removed by an anisotropic etching technique such as RIE. However, other materials and techniques as known to those skilled in the art may also be useful for forming the spacers 135, 137.

The drain region 114 and the recessed region 110 may be formed such that the conductivity region 124 is between the drain region 114 and the recessed region 110. In a non-limiting example, the source region 116 and the drain region 114 may be disposed at least partially within the substrate 102 by ion implantation. For example, an implant mask having openings to expose regions of the substrate 102 intended for the source and drain regions 116, 114 may be formed over the substrate 102, and either p-type dopants (when the source and drain regions 116, 114 have p-type conductivity) or n-type dopants (when the source and drain regions 116, 114 have n-type conductivity) may be introduced into the exposed regions of the substrate 102. The implant mask may then be removed. The implant mask may be a photoresist mask in a non-limiting example. Other materials and techniques as known to those skilled in the art may also be useful for disposing the source and drain regions 116, 114.

The body well tap 122 and the source region 116 may be formed such that the internal isolation region 126 is between the body well tap 122 and the source region 116. In a non-limiting example, the body well tap 122 may be formed by ion implantation. For example, an implant mask having an opening to expose the region of the substrate 102 intended for the body well tap 122 may be formed over the substrate 102, and either p-type dopants (when the body well tap 122 has p-type conductivity) or n-type dopants (when the body well tap 122 has n-type conductivity) may be introduced into the exposed region of the substrate 102. The implant mask may then be removed. Other materials and techniques as known to those skilled in the art may also be useful for forming the body well tap 122.

Figure 2F:
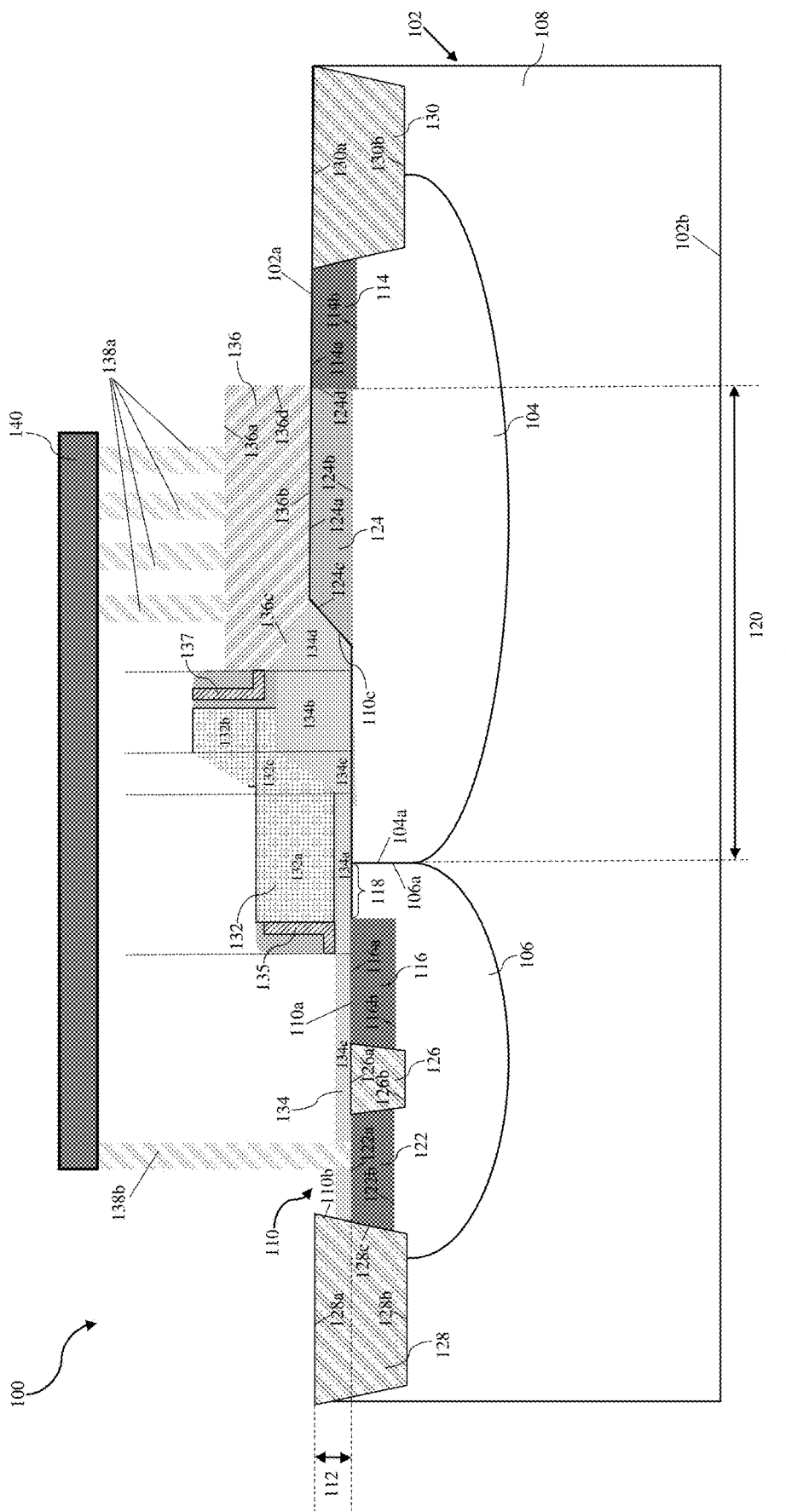

Referring to FIG. 2F, in a non-limiting embodiment, the method for fabricating the high voltage device 100 may further include arranging a silicide block 136 at least partially over the conductivity region 124, and forming the BEOL metallisation layer including the contacts 138a, 138b and the conductive line 140.

In a non-limiting example, the silicide block 136 may be formed by depositing a silicide block layer over the substrate 102 using for example, CVD or other suitable techniques as known to those skilled in the art. The silicide block layer may include a dielectric material, such as silicon nitride, but other materials as known to those skilled in the art may also be useful. The silicide block layer may then be patterned to form the silicide block 136. Patterning of the silicide block layer may be performed by forming a mask (such as a photoresist mask in a non-limiting example) over the silicon block layer and removing portions of the silicon block layer exposed by the mask using for example, an anisotropic etching technique such as RIE. Other techniques or materials as known to those skilled in the art may also be useful for forming the silicide block 136. The process described here for forming the silicide block 136 is often a part of a typical complementary-metal-oxide-semiconductor (CMOS) process flow and thus, no additional mask beyond those used for the typical CMOS process flow is required for forming the silicide block 136. This may help to reduce manufacturing costs of the high voltage device 100.

In a non-limiting example, the BEOL metallisation layer may be formed by a conventional BEOL process as known to those skilled in the art. For example, the contacts 138a, 138b may be formed by depositing an ILD layer over the substrate 102, the gate structure 132, the oxide layer 134, and the silicide block 136. The ILD layer may then be etched (using for example, a mask) to create openings for the contacts 138a, 138b, and the openings may be filled with a conductive material to form the contacts 138a, 138b. The excess conductive material may then be removed by, for example, a CMP process. An IMD layer may then be formed over the ILD layer and etched (using for example, a mask) to create one or more trenches for conductive lines such as the conductive line 140, and one or more trenches may be filled with a conductive material to form the conductive line 140. The excess conductive material may be removed by, for example, a CMP process. The ILD and IMD layers may be formed of silicon oxide, and the conductive material may be formed of silver, copper, gold, aluminium, alloys thereof, or combinations thereof, but other materials as known to those skilled in the art may also be useful.

The above described order of the steps for the method is only intended to be illustrative, and the steps of the method of the present invention are not limited to the above specifically described order unless otherwise specifically stated.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A high voltage device comprising: a substrate comprising a recessed region, the recessed region comprising a recessed surface arranged lower than a top surface of the substrate; a source region at least partially arranged within the substrate under the recessed surface; a drain region at least partially arranged within the substrate under the top surface and at a higher position than the source region; a gate structure comprising a first portion and a second portion arranged over the recessed region, wherein the first portion is nearer to the source region, and wherein the second portion is nearer to the drain region; and an oxide layer comprising a first part arranged between the first portion of the gate structure and the recessed surface of the recessed region and a second part arranged between the second portion of the gate structure and the recessed surface of the recessed region, wherein the second part of the oxide layer is thicker than the first part of the oxide layer, and wherein the first portion of the gate structure including a gate electrode portion, is in direct contact with an upper surface of the first part of the oxide layer.

2. The high voltage device according to claim 1, wherein a thickness of the second part of the oxide layer compared to a thickness of the first part of the oxide layer has a ratio ranging from 6:5 to 60:1.

3. The high voltage device according to claim 1, wherein the source region and the drain region have a first conductivity type, and wherein a conductivity region is at least partially arranged within the substrate between the drain region and the recessed region, wherein the conductivity region has a second conductivity type different from the first conductivity type.

4. The high voltage device according to claim 3, further comprising a silicide block arranged at least partially over the conductivity region.

5. The high voltage device according to claim 1, further comprising a silicide block adjacent to the second portion of the gate structure, and wherein the second portion of the gate structure extends vertically beyond a top surface of the silicide block.

6. The high voltage device according to claim 1, further comprising a body well tap at least partially arranged within the substrate and under the recessed surface and at a lower position than the drain region.

7. The high voltage device according to claim 6, wherein the body well tap is arranged at a same horizontal level as the source region under the recessed surface.

8. The high voltage device according to claim 6, further comprising an internal isolation region arranged between the body well tap and the source region, wherein the internal isolation region is arranged under the recessed surface.

9. The high voltage device according to claim 1, wherein the gate structure further comprises a third portion arranged over the recessed region and between the first portion and the second portion of the gate structure, and wherein the oxide layer further comprises a third part arranged between the third portion of the gate structure and the recessed surface of the recessed region.

10. The high voltage device according to claim 9, wherein the third part of the oxide layer has a thickness that increases linearly from a first end adjacent to the first part of the oxide layer to a second end adjacent to the second part of the oxide layer.

11. The high voltage device according to claim 3, wherein the oxide layer further comprises a fourth part arranged between the second part of the oxide layer and the conductivity region.

12. The high voltage device according to claim 11, wherein the fourth part of the oxide layer has a thickness that decreases linearly from a first end adjacent to the second part of the oxide layer to a second end adjacent to the conductivity region.

13. The high voltage device according to claim 5, wherein a first bottom surface of the silicide block is substantially aligned with the top surface of the substrate and the silicide block extends horizontally beyond the top surface of the substrate towards the second portion of the gate structure, such that a second bottom surface of the silicide block is arranged over the recessed region.

14. The high voltage device according to claim 13, wherein the second bottom surface of the silicide block is slanted at an angle with respect to the first bottom surface of the silicide block.

15. The high voltage device according to claim 13, wherein the oxide layer further comprises a fourth part disposed between the second bottom surface of the silicide block and the recessed region.

16. The high voltage device according to claim 4, further comprising first contacts in contact with the silicide block and second contacts in contact with a body well tap at least partially arranged within the substrate, and a conductive line configured to electrically couple the first contacts and the second contacts.

17. The high voltage device according to claim 1, wherein the high voltage device comprises a lateral double-diffused metal oxide semiconductor (LDMOS) transistor.

* * * * *